US009241412B2

(12) United States Patent
Zhou

(10) Patent No.: US 9,241,412 B2
(45) Date of Patent: Jan. 19, 2016

(54) MANUFACTURING METHOD OF FLEXIBLE DISPLAY SUBSTRATE

(71) Applicant: BOE Technology Group Co., Ltd., Beijing (CN)

(72) Inventor: Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 216 days.

(21) Appl. No.: 13/980,651

(22) PCT Filed: Nov. 1, 2012

(86) PCT No.: PCT/CN2012/083928
§ 371 (c)(1),
(2) Date: Jul. 19, 2013

(87) PCT Pub. No.: WO2013/189141
PCT Pub. Date: Dec. 27, 2013

(65) Prior Publication Data
US 2014/0059850 A1    Mar. 6, 2014

(30) Foreign Application Priority Data
Jun. 21, 2012    (CN) .......................... 2012 1 0212242

(51) Int. Cl.
B23P 21/00    (2006.01)
H05K 3/30    (2006.01)
(Continued)

(52) U.S. Cl.
CPC ............ *H05K 3/30* (2013.01); *G02F 1/133305* (2013.01); *G02F 1/1362* (2013.01); *H01L 27/1262* (2013.01); *Y10T 29/4913* (2015.01)

(58) Field of Classification Search
CPC    B32B 2457/208; B32B 37/02; H01L 27/323; H01L 51/0097; H05K 1/0393; H05K 3/007; H05K 3/0064; H05K 3/30; H05K 9/0094; H05K 2201/05; Y10T 29/49128; Y10T 29/4913; Y10T 29/49208; Y10T 29/49224; Y10T 29/49904
USPC ........... 29/469, 831, 832, 848, 851, 855, 858; 156/184, 289; 174/254; 361/742, 361/748–751, 804
See application file for complete search history.

(56) References Cited

U.S. PATENT DOCUMENTS 8,323,066 B2 * 12/2012 Kim ................................ 445/25
8,359,747 B2 *  1/2013 Matsuzawa .................. 29/890.1
(Continued)

FOREIGN PATENT DOCUMENTS

CN    1883061 A    12/2006
CN    101009207 A    8/2007
(Continued)

OTHER PUBLICATIONS

The State Intellectual Property Office of the People's Republic of China ("SIPO") (Chinese Language) Second Office Action issued on Apr. 23, 2014 by SIPO in Chinese Patent Application No. 201210212242.8; six (6) pages.
(Continued)

*Primary Examiner* — Paul D Kim

(57) ABSTRACT

An embodiment of the invention provides a manufacturing method of flexible display substrate (10) comprising: preparing a backing layer (2) on a carrier substrate (1); preparing a flexible base substrate (3) on the backing layer (2); preparing electronic components (4) on the flexible base substrate (3); and removing the backing layer (2) from the flexible base substrate (3) back to obtain a flexible display substrate (10).

8 Claims, 2 Drawing Sheets

(51) Int. Cl.
*G02F 1/1333* (2006.01)
*H01L 27/12* (2006.01)
*G02F 1/1362* (2006.01)

(56) References Cited

U.S. PATENT DOCUMENTS

| | | | |
|---|---|---|---|
| 8,481,364 B2* | 7/2013 | Chao et al. | 438/106 |
| 8,481,859 B2* | 7/2013 | Haq et al. | 174/254 |
| 8,876,998 B2* | 11/2014 | Park et al. | 156/247 |
| 2007/0034795 A1* | 2/2007 | Benje | 250/288 |
| 2007/0051034 A1* | 3/2007 | Dussaud | 47/32.7 |
| 2007/0059854 A1 | 3/2007 | Huang et al. | |
| 2007/0091062 A1 | 4/2007 | French et al. | |
| 2008/0099141 A1* | 5/2008 | Booth et al. | 156/331.7 |
| 2010/0291473 A1* | 11/2010 | Ji et al. | 429/532 |
| 2011/0124183 A1 | 5/2011 | Yasumatsu | |
| 2012/0118478 A1 | 5/2012 | Park et al. | |
| 2014/0008651 A1* | 1/2014 | Marrs | 257/43 |

FOREIGN PATENT DOCUMENTS

| | | |
|---|---|---|
| CN | 101937157 A | 1/2011 |
| CN | 102089858 A | 6/2011 |
| CN | 102184892 A | 9/2011 |
| CN | 102738078 A | 10/2012 |

OTHER PUBLICATIONS

English Translation of SIPO Office Action of Chinese Patent Application No. 201210212242.8, issued on Apr. 23, 2014; nine (9) pages.
Bibliographic data abstract (in English) of CN1883061(A), 1 page.
Bibliographic data abstract (in English) of CN101009207(A), 1 page.
Bibliographic data abstract (in English) of CN102184892(A), 1 page.
Bibliographic data abstract (in English) of CN101937157(A), 1 page.
Bibliographic data abstract (in English) of CN102089858(A), 1 page.
Bibliographic data abstract (in English) of CN102738078(A), 1 page.
The State Intellectual Property Office of the People's Republic of China ("SIPO") (Chinese Language) First Office Action issued on Sep. 29, 2013 by SIPO in Chinese Patent Application No. 201210212242.8; seven (7) pages.
English Translation of SIPO Office Action of Chinese Patent Application No. 201210212242.8, issued on Sep. 29, 2013; seven (7) pages.
PCT International Search Report ("ISR") of PCT/CN2012/083926 (Chinese language) issued on Jun. 21, 2012 by the International Searching Authority ("ISA"), thirteen (13) pages.
PCT International Preliminary Report on Patentability for PCT/CN2012/083928, dated Dec. 23, 2014; 7 pages.

* cited by examiner

MANUFACTURING METHOD OF FLEXIBLE DISPLAY SUBSTRATE

CROSS REFERENCE TO RELATED APPLICATIONS

This application is based on International Application No. PCT/CN2012/083928 filed on Nov. 1, 2012, which claims priority to Chinese National Application No. 201210212242.8, filed on Jun. 21, 2012, the contents of which are incorporated herein by reference.

BACKGROUND

The present invention relates to a manufacturing method of a flexible display substrate.

Flexible Display technology has a considerable development in recent ten years, thereby bring great improvements of a flexible display on the dimension of screen and the quality of display. A flexible display is also referred as to a rollable display which is a bendable display device constructed of visible flexible panel made of flexible materials. Both CRT that becomes extinct and LCD which is popular nowadays belong to a conventional rigid display substantially. Compared to the ordinary rigid display, a flexible display has multiple advantages: higher capability for impact resistance and shock resistance; light weight, small volume and more convenience for carrying; and low cost bring by using rolling process similar to a newspaper printing process.

Although the manufacturing methods for the current several flexible displays have respective characteristics, they have some common points. For example, they all need bonding a layer of flexible base substrate on a rigid seat which is hard and flat, producing electronic elements on the flexible base substrate to complete the flexible display substrate, and then peeling the completed flexible display substrate from the seat. To do this because it is needed to accurately fix the position and flatness of a flexible base substrate during the refined manufacture process of the display assembly, and the error can be accounted for the order of microns to ensure there is no misplace between the electronic elements.

The hard seat described above is generally glass materials, which has a rigidity satisfied the requirements, but does not has a sufficient flat surface which usually has undulation. When the electronic elements are produced on the flexible base substrate under a vacuum environment, the bubbles in the space on the glass surface generated due to undulation would raise several bubbles on the back of flexible base substrate which is relatively soft, and even cause the flexible base substrate to have plastic deformation which can not be recovered, i.e. a flexible display substrate would have plastic deformation which can not be resumed. The irregular unflatness of the flexible base substrate would cause the unevenness of the characteristics on the elements thereon, so as to affect the quality of the flexible display substrate.

SUMMARY

An embodiment of the invention provides a manufacturing method of a flexible display substrate comprising:
preparing a backing layer on a carrier substrate;
preparing a flexible base substrate on the backing layer;
preparing electronic components on the flexible base substrate; and
removing the backing layer from the back of the flexible base substrate to obtain a flexible display substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An embodiment of the invention provides a manufacturing method of a flexible display substrate which avoids a flexible base substrate from plastic deformation which can not be recovered.

An embodiment of the invention discloses a manufacturing method of a flexible display substrate. The manufacturing method of a flexible display substrate in the embodiments of the invention firstly prepares a backing layer on a carrier substrate, prepares a flexible base substrate on the backing layer, and then removes the backing layer to obtain a flexible display substrate. Because a back of the flexible base substrate only contacts with the backing layer but not contacts with the carrier substrate, no bubbles damage the back of the flexible base substrate, so as to avoid the plastic deformation of the flexible display substrate under the precondition that the precise fixing of position of the flexible base substrate and the flatness of the flexible base substrate are ensured.

Figure 1:
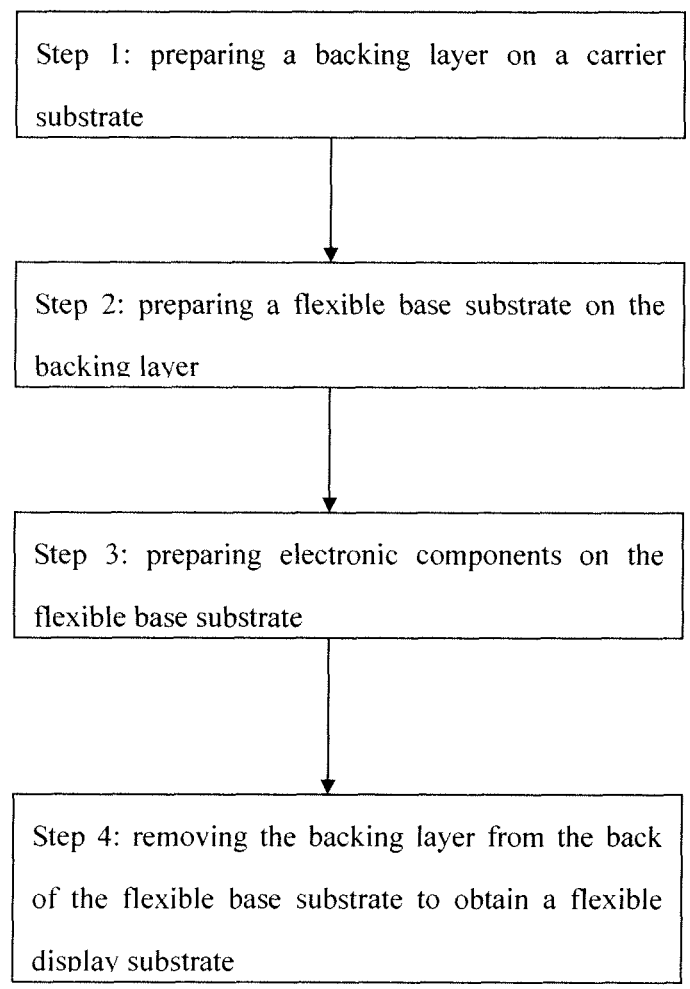
FIG. 1 is a schematic flowchart of a manufacturing method of a flexible display substrate in one embodiment of the invention.

As shown in FIG. 1, a manufacturing method of a flexible display substrate in one embodiment of the invention comprises:

Step 1, preparing a backing layer on a carrier substrate;
Step 2, preparing a flexible base substrate on the backing layer;
Step 3, preparing electronic components on the flexible base substrate;
Step 4, removing the backing layer from a back of the flexible base substrate to obtain a flexible display substrate.

The backing layer has a material which may, for example, be bonded closely to the materials of the flexible base substrate and the carrier substrate, such as photoresist and the like. The material of the flexible base substrate may, for example, be used to prepare the flexible base substrate and at the same time to be bonded closely to the material of the backing layer, such as polyimide and the like. The flexible display substrate in each embodiment of the invention, in general concept, comprises a flexible array substrate and a flexible color film substrate, and may further comprise a flexible display panel or the like.

The step of removing the backing layer from the back of the flexible base substrate in the manufacturing method of a flexible display substrate in the embodiments of the invention may comprises:

radiating the backing layer so that it undergoes a photolysis and then removing the backing layer by a removal solution. Such a removal way removes the backing layer using the chemical characteristics difference between the chemical characteristics of the backing layer and the flexible base substrate, which is more complete and efficient.

The step of preparing the backing layer on the carrier substrate in the manufacturing method of a flexible display substrate in the embodiments of the invention comprises: coating the front face of the carrier substrate with a layer of material of the backing layer, after dryness, obtaining the backing layer on the carrier substrate.

In the manufacturing method of a flexible display substrate in the embodiments of the invention, the carrier substrate is a transparent substrate; the step of said radiating the backing layer so that it undergoes a photolysis and then removing the backing layer by the removal solution comprises:

radiating the back of the carrier substrate so that the backing layer undergoes a photolysis; and removing the backing layer by removal solution causes the separation of the transparent substrate from the flexible base substrate. With radiating the back of the carrier substrate, lights transmit through the transparent substrate (carrier substrate) and are absorbed by the backing layer, but they will not radiate the flexible base substrate which ensures the backing layer to undergo a photolysis, while the flexible base substrate will not be affected substantially.

Further, the material of the backing layer used in the manufacturing method of a flexible display substrate in the embodiments of the invention may be a UV-degradable material. Since a yellow substrate may absorb ultraviolet light which affects the absorption of ultraviolet light by the backing layer so as to affect work efficiency, the carrier substrate used in this embodiment is a non-yellow substrate.

In the manufacturing method of a flexible display substrate in the embodiment of the invention, the material of the flexible base substrate is a non-UV-degradable material.

In the manufacturing method of a flexible display substrate in the embodiment of the invention, the material of the backing layer is positive photoresist and the material of the flexible base substrate is polyimide.

The removal solution is an acetone solution or a propylene glycol monomethyl ether acetate solution.

The carrier substrate is a glass substrate. The step of said radiating the backing layer so that it undergoes a photolysis and then removing the backing layer by the removal solution comprises:

radiating the back of the glass substrate with ultraviolet light so that the backing layer undergoes a photolysis, wherein the ultraviolet light radiated from the back of the carrier substrate has a wavelength, the wavelength at least comprises a wavelength for the photolysis that the material of the backing layer undergoes; after the completion of the photolysis, putting the whole substrate into a developing solution, dissolving and removing the backing layer, and finally taking out, cleaning and drying the flexible base substrate and the electronic components thereon to obtain a flexible display substrate.

The manufacturing method of a flexible display substrate in the embodiments of the invention comprising four steps: the step of preparing a backing layer on the carrier substrate, the step of preparing the flexible base substrate on the backing layer, the step of preparing electronic components on the flexible base substrate and the step of removing the backing layer from the back of the flexible base substrate to obtain the flexible display substrate, which are all performed in a yellow light area. As such, it is ensured that ultraviolet light only has an effect on the backing layer, but has no damage to the flexible base substrate.

In the manufacturing method of a flexible display substrate in the embodiments of the invention, a backing layer is first prepared on the carrier substrate, and the flexible base substrate is prepared on the backing layer, then the backing layer is removed to obtain the flexible display substrate. Since the back of the flexible base substrate only contacts with the backing layer, but will not contacts with the carrier substrate, no bubbles damage the back of the flexible base substrate, thereby avoiding the plastic deformation of the flexible display substrate under the precondition that the precise fixing of the position of the flexible base substrate and the flatness of the flexible base substrate are ensured.

Figure 2:
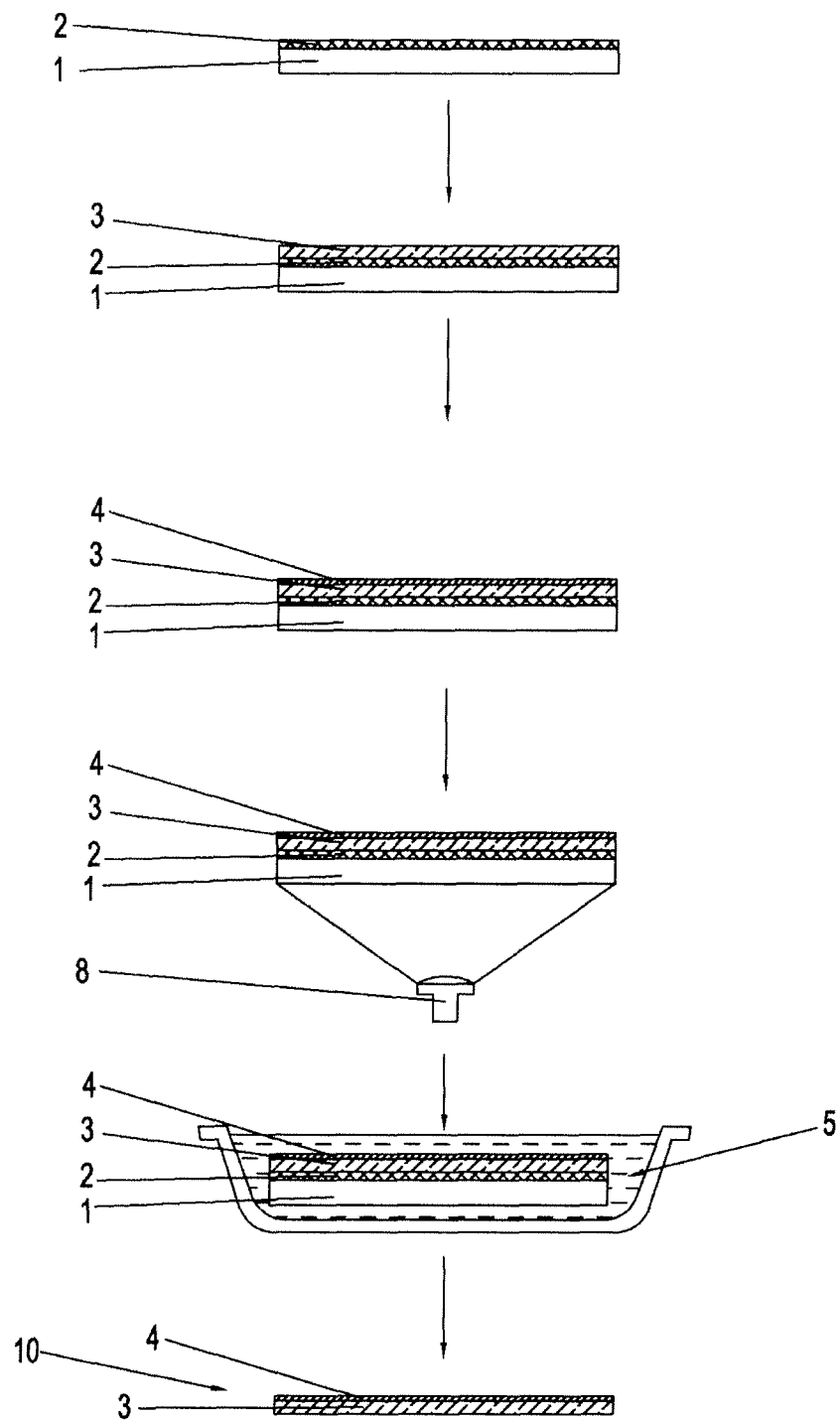
FIG. 2 is a schematic sectional view of respective steps of the manufacturing method of flexible display substrate in another embodiment of the invention.

FIG. 2 is a schematic sectional view of a flexible display substrate in respective steps of the manufacturing method of flexible display substrate in another embodiment of the invention. As shown in FIG. 2, the sequence of the steps is represented by the arrows in the figure. The preparing method of a flexible display substrate in the embodiment comprises the following steps:

a step of preparing a backing layer 2 on a carrier substrate 1 comprising: coating a transparent, non-yellow glass substrate 1 with a UV-degradable material, and after it dried (i.e., after the solvent is removed), obtaining the backing layer 2; in other embodiments of the invention, the glass substrate 1 may be substituted by an organic substrate which is flat and smooth; in this embodiment, the material of the backing layer is positive photoresist;

a step of preparing a flexible base substrate 3 on the backing layer 2, comprises: coating the positive photoresist dry film after the removal of the solvent with a thicker layer of UV-curable polyimide slurry, after leveling, performing treatments of removing the solvent, imidization and photocuring using a conventional method for preparing polyimide film, to produce a polyimide film with a thickness of 0.09~250 microns as a flexible base substrate 3;

a step of preparing electronic components on the flexible base substrate 3 obtained in the abovesaid step comprising: preparing electronic components 4 on the flexible base substrate 3 of polyimide material using conventional process; and a step of removing the backing layer 2 from the back of the flexible base substrate 3 to obtain a flexible display substrate 10 comprising: after the completion of preparing components, radiating the back of the glass substrate 1 with ultraviolet light using a ultraviolet lamp 8 such that the backing layer 2 may undergoes a photolysis, after the photolysis, putting the entire substrate into a developing solution 5 serving as a removal solution to dissolving the backing layer 2, and finally taking out, cleaning and drying the flexible base substrate 3 and the electronic components 4 thereon to obtain a flexible display substrate 10, such that the entire preparation of the flexible display substrate is completed.

The developing solution in the embodiments of the invention may be tetramethylammonium hydroxide solution or potassium hydroxide solution. The removal solution may be an acetone solution or a propylene glycol monomethyl ether acetate solution.

The carrier substrate in the embodiments of the invention may be organic materials such as polytetrafluoro material, high density polyethylene, polycarbonate, high density polypropylene, and the like.

Because yellow light would absorb ultraviolet light, to ensure that the flexible base substrate would not be affected by ultraviolet light, the four steps of the manufacturing method of a flexible display substrate in the embodiment are all performed within the yellow light area wherein the environmental light is yellow light.

The back of the flexible base substrate in the embodiment only contacts with the backing layer, in which no bubbles would damage the back of the flexible base substrate, thereby avoiding the plastic deformation of the flexible display substrate under the precondition that the precise fixing of the position of the flexible base substrate and the flatness of the flexible base substrate are ensured.

According to the above description, the embodiments of the invention at least provide the following method:

(1) a manufacturing method of a flexible display substrate comprising:
preparing a backing layer on a carrier substrate;
preparing a flexible base substrate on the backing layer;
preparing electronic components on the flexible base substrate; and
removing the backing layer from the back of the flexible base substrate to obtain a flexible display substrate.

(2) the manufacturing method of a flexible display substrate according to (1), wherein said removing the backing layer from the back of the flexible base substrate comprises:
radiating the backing layer so that it undergoes a photolysis, and then removing the backing layer by a removal solution.

(3) the manufacturing method of flexible display substrate according to (1), wherein said preparing the backing layer on the carrier substrate comprises: coating the front face of the carrier substrate with a layer of material of the backing layer; after dryness, obtaining the backing layer on the carrier substrate.

(4) the manufacturing method of flexible display substrate according to (2), wherein the carrier substrate is a transparent substrate; and said radiating the backing layer so that it undergoes a photolysis and then removing the backing layer by a removal solution comprises:
radiating the back of the carrier substrate so that the backing layer undergoes a photolysis; and
removing the backing layer by a removal solution to separate the transparent substrate from the flexible base substrate.

(5) the manufacturing method of flexible display substrate according to (4), wherein the material of the backing layer is a UV-degradable material, and the carrier substrate is a non-yellow substrate.

(6) the manufacturing method of flexible display substrate according to (5), wherein the material of the backing layer is positive photoresist, and the material of the flexible base substrate is polyimide.

(7) the manufacturing method of flexible display substrate according to (6), wherein the removal solution is an acetone solution or a propylene glycol monomethyl ether acetate solution.

(8) the manufacturing method of flexible display substrate according to (6), wherein the carrier substrate is a glass substrate, and said radiating the backing layer so that it undergoes a photolysis and then removing the backing layer by the removal solution comprises:
radiating the back of the glass substrate with ultraviolet light so that the backing layer undergoes a photolysis, after the completion of the photolysis, putting the whole substrate into a developing solution, dissolving and removing the backing layer, and finally taking out, cleaning and drying the flexible base substrate and the electronic components thereon to obtain a flexible display substrate.

(9) the manufacturing method of flexible display substrate according to (4) to (8), wherein said preparing a backing layer on the carrier substrate, said preparing a flexible base substrate on the backing layer, said preparing electronic components on the flexible base substrate, and said removing the backing layer from the back of the flexible base substrate to obtain the flexible display substrate, are all performed in a yellow light area.

(10) the manufacturing method of flexible display substrate according to (1), wherein the material of the backing layer is photoresist, and/or the material of the flexible base substrate is polyimide.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. A manufacturing method of a flexible display substrate comprising:
preparing a backing layer on a transparent glass carrier substrate;
preparing a flexible base substrate on the backing layer;
preparing electronic components on the flexible base substrate; and
removing the backing layer from the back of the flexible base substrate to obtain a flexible display substrate, wherein said removing the backing layer from the back of the flexible base substrate comprises: radiating the back of the transparent glass carrier substrate with ultraviolet light so that the backing layer undergoes a photolysis, and after the completion of the photolysis, putting the whole substrate into a developing solution, dissolving and removing the backing layer, and finally taking out, cleaning and drying the flexible base substrate and the electronic components thereon to obtain a flexible display substrate.

2. The manufacturing method of a flexible display substrate according to claim 1, wherein the material of the backing layer is a UV-degradable material, and the transparent glass carrier substrate is a non-yellow substrate.

3. The manufacturing method of a flexible display substrate according to claim 2, wherein the material of the backing layer is positive photoresist, and the material of the flexible base substrate is polyimide.

4. The manufacturing method of a flexible display substrate according to claim 3, wherein the removal solution is an acetone solution or a propylene glycol monomethyl ether acetate solution.

5. The manufacturing method of a flexible display substrate according claim 1, wherein the material of the backing layer is photoresist.

6. The manufacturing method of a flexible display substrate according claim 1, wherein said preparing a backing layer on the transparent glass carrier substrate; said preparing a flexible base substrate on the backing layer, said preparing electronic components on the flexible base substrate, and said removing the backing layer from the back of the flexible base substrate to obtain the flexible display substrate, are all performed in a yellow light area.

7. The manufacturing method of a flexible display substrate according to claim 6, wherein preparing the backing layer on the transparent glass carrier substrate comprises: coating the front face of the carrier substrate with a layer of material of the backing layer; and after dryness, obtaining the backing layer on the carrier substrate.

8. The manufacturing method of a flexible display substrate according claim 1, wherein the material of the flexible base substrate is polyimide.

\* \* \* \* \*